US007923376B1

(12) United States Patent
Dhas et al.

(10) Patent No.: US 7,923,376 B1
(45) Date of Patent: Apr. 12, 2011

(54) METHOD OF REDUCING DEFECTS IN PECVD TEOS FILMS

(75) Inventors: N. Arul Dhas, Sherwood, OR (US); Jon Henri, West Linn, OR (US)

(73) Assignee: Novellus Systems, Inc., San Jose, CA (US)

( * ) Notice: Subject to any disclaimer, the term of this patent is extended or adjusted under 35 U.S.C. 154(b) by 147 days.

(21) Appl. No.: 11/396,303

(22) Filed: Mar. 30, 2006

(51) Int. Cl.
*H01L 21/31* (2006.01)

(52) U.S. Cl. .................................. 438/758; 438/787

(58) Field of Classification Search ............ 438/758, 438/770, 778, 787
See application file for complete search history.

(56) References Cited

U.S. PATENT DOCUMENTS

| 4,357,451 | A |   | 11/1982 | McDaniel |         |
|-----------|---|---|---------|----------|---------|
| 4,872,947 | A | * | 10/1989 | Wang et al. | 216/38 |
| 4,882,008 | A |   | 11/1989 | Garza et al. |     |
| 4,885,262 | A |   | 12/1989 | Ting et al. |      |
| 5,166,101 | A | * | 11/1992 | Lee et al. | 438/763 |
| 5,354,715 | A | * | 10/1994 | Wang et al. | 438/699 |
| 5,426,076 | A | * | 6/1995  | Moghadam | 438/699 |
| 5,504,042 | A |   | 4/1996  | Cho et al. |       |
| 5,518,959 | A | * | 5/1996  | Jang et al. | 438/627 |
| 5,674,783 | A | * | 10/1997 | Jang et al. | 438/697 |
| 5,686,054 | A |   | 11/1997 | Barthel et al. |   |
| 5,700,844 | A |   | 12/1997 | Hedrick et al. |   |
| 5,789,027 | A |   | 8/1998  | Watkins et al. |   |
| 5,849,640 | A |   | 12/1998 | Hsia et al. |      |
| 5,851,715 | A |   | 12/1998 | Barthel et al. |   |
| 5,858,457 | A |   | 1/1999  | Brinker et al. |   |
| 5,920,790 | A |   | 7/1999  | Wetzel et al. |    |
| 6,140,252 | A |   | 10/2000 | Cho et al. |       |
| 6,149,828 | A |   | 11/2000 | Vaartstra |        |
| 6,171,661 | B1 |  | 1/2001  | Zheng et al. |     |
| 6,177,329 | B1 |  | 1/2001  | Pang |             |
| 6,232,658 | B1 |  | 5/2001  | Catabay et al. |   |
| 6,258,735 | B1 |  | 7/2001  | Xia et al. |       |
| 6,268,276 | B1 |  | 7/2001  | Chan et al. |      |
| 6,270,846 | B1 |  | 8/2001  | Brinker et al. |   |
| 6,271,273 | B1 |  | 8/2001  | You et al. |       |
| 6,306,564 | B1 |  | 10/2001 | Mullee |           |
| 6,312,793 | B1 |  | 11/2001 | Grill et al. |     |
| 6,329,017 | B1 |  | 12/2001 | Liu et al. |       |
| 6,329,062 | B1 |  | 12/2001 | Gaynor |           |

(Continued)

FOREIGN PATENT DOCUMENTS

WO WO95/07543 3/1995

OTHER PUBLICATIONS

Cho et al., "Plasma Treatments of Molecularly Templated Nanoporous Silica Films," Electrochemical and Solid-State Letters, 4 (4) G35-G38 (2001).

(Continued)

*Primary Examiner* — Brook Kebede
(74) *Attorney, Agent, or Firm* — Weaver Austin Villeneuve & Sampson LLP

(57) ABSTRACT

The present invention provides high deposition rate PECVD methods for depositing TEOS films. The methods significantly reduce the number of particles in the TEOS films, thereby eliminating or minimizing defects. According to various embodiments, the methods involve adding a relatively small amount of helium gas to the process gas. The addition of helium significantly reduces the number of defects in the film, particularly for high deposition rate processes.

19 Claims, 3 Drawing Sheets

U.S. PATENT DOCUMENTS

| | | | |
|---|---|---|---|
| 6,331,480 B1 | 12/2001 | Tsai et al. | |
| 6,340,628 B1 | 1/2002 | Van Cleemput et al. | |
| 6,365,266 B1 | 4/2002 | MacDougall et al. | |
| 6,383,466 B1 | 5/2002 | Domansky et al. | |
| 6,383,955 B1 | 5/2002 | Matsuki et al. | |
| 6,386,466 B1 | 5/2002 | Ozawa et al. | |
| 6,387,453 B1 | 5/2002 | Brinker et al. | |
| 6,391,932 B1 | 5/2002 | Gore et al. | |
| 6,392,017 B1 | 5/2002 | Chandrashekar | |
| 6,420,441 B1 | 7/2002 | Allen et al. | |
| 6,444,715 B1 | 9/2002 | Mukherjee et al. | |
| 6,455,417 B1 | 9/2002 | Bao et al. | |
| 6,479,374 B1 | 11/2002 | Ioka et al. | |
| 6,500,770 B1 | 12/2002 | Cheng et al. | |
| 6,530,380 B1 * | 3/2003 | Zhou et al. | 134/1.2 |
| 6,548,113 B1 | 4/2003 | Birnbaum et al. | |
| 6,573,030 B1 | 6/2003 | Fairbairn et al. | |
| 6,576,345 B1 | 6/2003 | Cleemput et al. | |
| 6,596,467 B2 | 7/2003 | Gallagher et al. | |
| 6,596,654 B1 | 7/2003 | Bayman et al. | |
| 6,610,362 B1 | 8/2003 | Towle | |
| 6,632,478 B2 | 10/2003 | Gaillard et al. | |
| 6,667,147 B2 | 12/2003 | Gallagher et al. | |
| 6,677,251 B1 | 1/2004 | Lu et al. | |
| 6,715,498 B1 | 4/2004 | Humayun et al. | |
| 6,756,085 B2 | 6/2004 | Waldfried et al. | |
| 6,797,643 B2 | 9/2004 | Rocha-Alvarez et al. | |
| 6,805,801 B1 | 10/2004 | Humayun et al. | |
| 6,812,043 B2 | 11/2004 | Bao et al. | |
| 6,815,373 B2 | 11/2004 | Singh et al. | |
| 6,831,284 B2 | 12/2004 | Demos et al. | |
| 6,846,380 B2 | 1/2005 | Dickinson et al. | |
| 6,848,458 B1 | 2/2005 | Shrinivasan et al. | |
| 6,849,549 B1 | 2/2005 | Chiou et al. | |
| 6,867,086 B1 | 3/2005 | Chen et al. | |
| 6,903,004 B1 | 6/2005 | Spencer et al. | |
| 6,914,014 B2 | 7/2005 | Li et al. | |
| 6,943,121 B2 | 9/2005 | Leu et al. | |
| 7,018,918 B2 | 3/2006 | Kloster et al. | |
| 7,087,271 B2 | 8/2006 | Rhee et al. | |
| 7,087,497 B2 | 8/2006 | Yuan et al. | |
| 7,094,713 B1 | 8/2006 | Niu et al. | |
| 2002/0001973 A1 | 1/2002 | Wu et al. | |
| 2002/0016085 A1 | 2/2002 | Huang et al. | |
| 2002/0034626 A1 | 3/2002 | Liu et al. | |
| 2002/0064341 A1 | 5/2002 | Fauver et al. | |
| 2002/0106500 A1 | 8/2002 | Albano et al. | |
| 2002/0123240 A1 | 9/2002 | Gallagher et al. | |
| 2002/0141024 A1 | 10/2002 | Retschke et al. | |
| 2002/0192980 A1 | 12/2002 | Hogle et al. | |
| 2003/0064607 A1 | 4/2003 | Leu et al. | |
| 2003/0066544 A1 | 4/2003 | Jur et al. | |
| 2003/0119307 A1 | 6/2003 | Bekiaris et al. | |
| 2003/0157248 A1 | 8/2003 | Watkins et al. | |
| 2003/0194493 A1 | 10/2003 | Chang et al. | |
| 2003/0198895 A1 | 10/2003 | Toma et al. | |
| 2004/0069410 A1 | 4/2004 | Moghadam et al. | |
| 2004/0096586 A1 | 5/2004 | Schulberg et al. | |
| 2004/0096593 A1 | 5/2004 | Lukas et al. | |
| 2004/0096672 A1 | 5/2004 | Lukas et al. | |
| 2004/0099952 A1 | 5/2004 | Goodner et al. | |
| 2004/0101633 A1 | 5/2004 | Zheng et al. | |
| 2004/0102031 A1 | 5/2004 | Kloster et al. | |
| 2004/0102032 A1 | 5/2004 | Kloster et al. | |
| 2004/0161532 A1 | 8/2004 | Kloster et al. | |
| 2004/0170760 A1 | 9/2004 | Meagley et al. | |
| 2004/0185679 A1 | 9/2004 | Ott et al. | |
| 2005/0064698 A1 | 3/2005 | Chang et al. | |
| 2005/0196929 A1 | 9/2005 | Yuan et al. | |
| 2006/0110931 A1 | 5/2006 | Fukazawa et al. | |
| 2006/0197881 A1 | 9/2006 | Kang et al. | |

OTHER PUBLICATIONS

Yung et al., "Spin-on Mesoporous Silica Films with Ultralow Dielectric Constants, Ordered Pore Structures, and Hydrophobic Surfaces," Adv. Mater. 2001, 13, No. 14, 1099-1102.

Schulberg et al., "System for Deposition of Mesoporous Materials," U.S. Appl. No. 10/295,965, filed Nov. 15, 2002, 64 Pages.

Watkins et al., "Mesoporous Materials and Methods," U.S. Appl. No. 10/301,013, filed Nov. 21, 2002, 34 Pages.

Justin F. Gaynor, "In-Situ Treatment of Low-K Films With a Silylating Agent After Exposure To Oxidizing Environments," U.S. Appl. No. 10/056,926 filed Jan. 24, 2002, 34 Pages.

Humayun et al., "Method for Forming Porous Films by Porogen Removel Combined Wtih In SITU Surface Modification", Novellus Corporation, U.S. Appl. No. 10/404,693, filed Mar. 31, 2003, pp. 1-32.

Tipton et al., "Method Of Porogen Removal From Porous Low-K Films Using UV Radiation", Novellus Systems, Inc., U.S. Appl. No. 10/672,311, filed Sep. 26, 2003, pp. 1-27.

Jan, C.H., et al, *90NM Generation, 300mm Wafer Low k ILD/Cu Interconnect Technology*, 2003 IEEE Interconnect Technology Conference.

Wu et al., U.S. Appl. No. 10/789,103, entitled: Methods for Producing Low-K CDO Films With Low Residual Stress.

Wu et al., U.S. Appl. No. 10/820,525 , entitled: Methods for Producing Low-K CDO Films With Low Residual Stress.

Wu et al., U.S. Appl. No. 10/800,409 , entitled: Methods for Producing Low-K CDO Films.

U.S. Appl. No. 10/016,017, filed Dec. 12, 2001.

U.S. Appl. No. 10/125,614, filed Apr. 18, 2002.

U.S. Appl. No. 10/202,987, filed Jul. 23, 2002.

Tipton et al., "Method for Removal of Porogens From Porous Low-K Films Using Supercritical Fluids", Novellus Systems, Inc., U.S. Appl. No. 10/672,305, filed Sep. 26, 2003, pp. 1-32.

Gangpadhyay et al., "The First International Surface Cleaning Workshop," Northeastern University, Nov. 11-14, 2002.

Cho et al., "Method and Apparatus for UV Exposure of Low Dielectric Constant Materials for Porogen Removal and Improved Mechanical Properties", Novellus Systems, Inc., U.S. Appl. No. 10/800,377, filed Mar. 11, 2004, pp. 1-31.

Wu et al., "Method and Apparatus of UV Exposure of Low Dielectric Constant Materials for Porogen Removal and Improved Mechanical Properties", Novellus Systems, Inc., U.S. Appl. No. 10/807,680, filed Mar. 23, 2004, pp. 1-34.

Humayun et al., "Method For Forming Porous Films By Porogen Removal Combined With In Situ Modification", U.S. Appl. No. 10/404,693, filed Mar. 31, 2003, Office Action dated Mar. 15, 2005.

Tipton et al., "Method Of Porogen Removal From Porous Low-K Films Using UV Radiation", U.S. Appl. No. 10/672,311, filed Sep. 26, 2003, Office Action dated Sep. 7, 2004.

Tipton et al., "Method Of Porogen Removal From Porous Low-K Films Using UV Radiation", U.S. Appl. No. 10/672,311, filed Sep. 26, 2003, Office Action dated Dec. 28, 2004.

Tipton et al., "Method For Removal Of Porogens From Porous Low-K Films Using Supercritical Fluids", U.S. Appl. No. 10/672,305, filed Sep. 26, 2003, Office Action dated Mar. 22, 2005.

Bandyopadhyay et al., "Method to Improve Mechanical Strength of Low-K Dielectric Film Using Modulated UV Exposure", U.S. Appl. No. 10/825,888, filed Apr. 16, 2004.

R.D. Miller et al., "Phase-Separated Inorganic-Organic Hybrids for Microelectronic Applications," MRS Bulletin, Oct. 1997, pp. 44-48.

Jin et al., "Nanoporous Silica as an Ultralow-*k* Dielectric," MRS Bulletin, Oct. 1997, pp. 39-42.

Asoh et al., "Fabrication of Ideally Ordered Anodic Porous Alumina with 63 nm Hole Periodocity Using Sulfuric Acid," J. Vac. Sci. Technol. B 19(2), Mar./Apr. 2001, pp. 569-572.

Asoh et al., "Conditions for Fabrication of Ideally Ordered Anodic Porous Alumina Using Pretextured Al," Journal of the Electrochemica Society, 148 (4) B152-B156 (2001) pp. B152-B156.

Holland et al., "Nonlithographic Technique for the Production of Large Area High Density Gridded Field Sources," J. Vac. Sci. Technol. B 17(2), Mar./Apr. 1999, pp. 580-582.

Masuda et al. "Highly Ordered Nanochannel-Array Architecture in Anodic Alumina," App. Phys. Lett. 71(19), Nov. 1997, pp. 2770-2772.

Clube et al., White Paper from Holotronic Technologies SA; downloaded from www.hdotronic.com/whitepaper/fine-patt.pdf on Mar. 12, 2002.

Meli et al., "Self-Assembled Masks for the Transfer of Nanometer-Scale Patterns into Surfaces: Characterization by AFM and LFM", Nano Letters, vol. 2, No. 2, 2002, 131-135.

"Shipley Claims Porous Low K Dielectric Breakthrough," Press Release Mar. 17, 2003.

Jeffrey M. Calvert and Michael K. Gallagher, Semiconductor International, 26 (12), 56 (2003).

Van Bevel et al., Future Fab International, 16, (2004).

Caluwaerts et al, "Post Patterning Meso Porosity Creation: A Potential Solution For Pore Sealing," IITC 2003.

Peter Singer, "New Materials and Designs to Improve Transistor Performance", Apr. 1, 2004, Semiconductor International.

Ghani et al, "A 90nm High Volume Manufacturing Logic Technology Featuring Novel 45nm Gate Length Strained Silicon CMOS Transistors", IEEE, © 2003.

Bhadri N. Varadarajan, "Tensile Silicon Nitride—P1264 NESL", C & F Study, Aug. 21, 2003.

Varadarajan, et al., "Strained Transistor Architecture and Method", Novellus Systems, Inc., U.S. Appl. No. 10/923,259, filed Aug. 20,2004, pp. 1-24.

Niu et al., "Methods For Improving The Cracking Resistance Of Low-K Dielectric Materials", U.S. Appl. No. 10/860,340, Office Action dated Mar. 2, 2005.

Niu et al., "Methods For Improving The Cracking Resistance of Low-K Dielectric Materials", U.S. Appl. No. 10/860,340, Final Office Action dated Jun. 13, 2005.

Wang et al., "Plasma Detemplating and Silanol Capping Of Porous Dielectric Films", U.S. Appl. No. 10/785,235, filed Feb. 23, 2004.

Varadarajan et al., "Tensile Dielectric Films Using UV Curing", U.S. Appl. No. 10/972,084, filed Oct. 22, 2004.

Fox et al., "Method For Improving Mechanical Properties of Low Dielectric Constant Materials", U.S. Appl. No. 10/849,568, filed May 18, 2004.

Fox et al., "Methods For Producing Low-Stress Carbon-Doped Oxide Films With Improved Integration Properties", U.S. Appl. No. 10/987,208, filed Nov. 12, 2004.

Van Den Hoek et al., "VLSI Fabrication Processes For Introducing Pores Into Dielectric Materials," U.S. Appl. No. 11/050,621, filed Jan. 31, 2005.

Draeger et al., "Creation Of Porosity in Low-K Films by Photo-Disassociation Of Imbedded Nanoparticles," U.S. Appl. No. 11/146,456, filed Jun. 6, 2005.

Wu et al., "Methods For Producing Low Stress Porous Low-K Dielectric Materials Using Precursors With Organic Functional Groups", U.S. Appl. No. 10/927,777, filed Aug. 27, 2004.

Wu et al., "Methods for Improving Integration Performance Of Low Stress CDO Films", U.S. Appl. No. 10/941,502, filed Sep. 14, 2004.

Cho et al., "Methods of Improving Porogen Removal and Film Mechanical Strength in Producing Ultra Low-K Carbon Doped Oxide Films Using Radical Photopolymerization", U.S. Appl. No. 10/982,654, filed Nov. 5, 2004.

U.S. Office Action mailed Jul. 13, 2005, from U.S. Appl. No. 10/672,311.

U.S. Office Action mailed Jul. 27, 2005, from U.S. Appl. No. 10/785,235.

U.S. Office Action mailed Aug. 24, 2005, from U.S. Appl. No. 10/404,693.

U.S. Office Action mailed Sep. 1, 2005, from U.S. Appl. No. 10/672,305.

Cho et al., "Mehtod for Porogen Removal and Mechanical Strength Enhancement of Low-K Carbon Doped Silicon Oxide Using Low Thermal Budget Microwave Curing", U.S. Appl. No. 11/280;113, filed Nov. 15, 2005.

U.S. Office Action mailed Dec. 20, 2005, U.S. Appl. No. 10/672,311.

U.S. Office Action mailed Feb. 7, 2006, from U.S. Appl. No. 10/672,305.

U.S. Office Action mailed Dec. 20, 2005, from U.S. Appl. No. 10/849,568.

U.S. Office Action mailed Jan. 9, 2006, from U.S. Appl. No. 10/785,235.

U.S. Office Action mailed Dec. 27, 2005, from U.S. Appl. No. 10/789,103.

U.S. Office Action mailed Dec. 23, 2005, from U.S. Appl. No. 10/800,409.

Subramonium et al., "Pulsed PECVD Method for Modulating Hydrogen Content in Hard Mask", U.S. Appl. No. 11/318,269, filed Dec. 23, 2005.

U.S. Office Action mailed Feb. 28, 2006, from U.S. Appl. No. 10/404,693.

U.S. Office Action mailed Mar. 29, 2006, from U.S. Appl. No. 10/800,377.

U.S. Office Action mailed May 31, 2006, from U.S. Appl. No. 10/941,502.

U.S. Office Action mailed May 30, 2006, from U.S. Appl. No. 10/785,235.

U.S. Office Action mailed May 31, 2006, from U.S. Appl. No. 10/849,568.

U.S. Office Action mailed May 2, 2006, from U.S. Appl. No. 11/050,621.

U.S. Office Action mailed Jun. 15, 2006, from U.S. Appl. No. 10/800,409.

Kelman et al., "Method for Reducing Stress in Porous Dielectric Films", U.S. Appl. No. 11/369,311, filed Mar. 6, 2006.

U.S. Office Action mailed Jun. 28, 2006, from U.S. Appl. No. 10/825,888.

U.S. Office Action mailed May 2, 2006, from U.S. Appl. No. 10/295,965.

U.S. Office Action mailed Aug. 9, 2005, from U.S. Appl. No. 10/295,965.

U.S. Office Action mailed Jun. 14, 2006, from U.S. Appl. No. 10/789,103.

U.S. Office Action mailed Sep. 8, 2006, from U.S. Appl. No. 10/404,693.

U.S. Office Action mailed Sep. 7, 2006, from U.S. Appl. No. 10/820,525.

U.S. Office Action mailed Jul. 12, 2006, from U.S. Appl. No. 10/672,305.

Wu et al., "Methods for Fabricating High Hardness/Modules Low Dielectric Constant Materials," Novellus Systems, Inc., U.S. Appl. No. 11/369,658, filed Mar. 6, 2006, pp. 1-33.

Henri, et al., "Method Of Eliminating Small Bin Defects In High Throughput Teos Films," Novellus Systems, Inc., U.S. Appl. No. 11/602,564, filed Nov. 20, 2006.

U.S. Office Action for U.S. Appl. No. 11/602,564 mailed Feb. 15, 2008.

U.S. Final Office Action for U.S. Appl. No. 11/602,564 mailed Sep. 4, 2008.

U.S. Office Action for U.S. Appl. No. 11/602,564 mailed Mar. 20, 2009.

Notice of Allowance for U.S. Appl. No. 11/602,564 mailed Dec. 14, 2009.

Allowed Claims for Application No. 11/602,564.

Henri, et al., "Method Of Eliminating Small Bin Defects in High Throughput Teos Films," Novellus Systems, Inc., U.S. Appl. No. 12/723,504, filed Mar. 12, 2010.

* cited by examiner

METHOD OF REDUCING DEFECTS IN PECVD TEOS FILMS

BACKGROUND

The present invention pertains to methods for depositing dielectric film on a substrate. More specifically, the invention pertains to high deposition rate PECVD TEOS processes. The invention is effective at producing high quality, low defect PECVD TEOS films.

TEOS (tri-ethoxy-organo-silicate) is a silicon-containing compound that is a liquid at room temperature. TEOS is used in many applications to deposit dielectric film on a substrate, e.g., in place of silane. TEOS is used in applications where conformality is required as silicon dioxide (or "TEOS oxide") films deposited by TEOS chemical vapor deposition processes have good conformality. TEOS oxide is often deposited by a plasma enhanced deposition chemical vapor deposition (PECVD) process.

TEOS-based PECVD processes typically involve exposing a substrate to a process gas including TEOS and an oxidant such as oxygen or ozone. Most processes for depositing TEOS are low deposition rate processes, resulting in at most about 3000-4000 angstroms/min (on a bare substrate). It would be desirable to have high deposition rate processes for depositing TEOS films. However, to date, high deposition rate methods of depositing a silicon oxide films result in films with a high number of defects.

What are needed therefore are improved methods for depositing TEOS films.

SUMMARY OF THE INVENTION

The present invention meets these needs by providing high deposition rate PECVD methods for depositing TEOS films. The methods significantly reduce the number of particles in the TEOS films, thereby eliminating or minimizing defects. According to various embodiments, the methods of the invention involve adding a small amount of helium to the process gas. The addition of helium significantly reduces the number of defects in the film, particularly for high deposition rate processes.

One aspect of the invention relates to a high deposition rate method of forming a dielectric material on a substrate involving providing a semiconductor device substrate in a deposition chamber; exposing the substrate to a process gas comprising TEOS, an oxidant, e.g., oxygen, and helium; and depositing on the substrate a dielectric film by a plasma enhanced chemical vapor deposition (PECVD) process.

Deposition rates depend on the flow rates of the reactant gases as well as other process conditions. According to various embodiments, the deposition rate may be at least about 7000 angstroms/min-10,000 angstroms/min. TEOS flow rates typically range from about 13-20 ml/min prior to vaporization. Oxygen flow rates typically range from about 8000-16000 sccm, and in some embodiments from about 8000-12000 sccm. According to various embodiments, helium flow rates range between about 1000 sccm and 4000 sccm, for example about 2000 sccm.

Another aspect of the invention relates to a high deposition rate method of forming a tensile TEOS oxide film on a substrate involving providing a semiconductor device substrate in a deposition chamber; exposing the substrate to a process gas comprising to a process gas comprising TEOS, oxygen (or other oxidant) and helium; wherein the TEOS flow rate is between about 15-20 ml/min prior to vaporization and the oxygen flow rate is between about 8000-12000 sccm and depositing on the substrate a dielectric film by a plasma enhanced chemical vapor deposition (PECVD) process. According to various embodiments, the helium flow rate is between about 1000-4000 sccm, for example about 2000 sccm. Also according to various embodiments, the total RF power is between about 1500-2000 W. In certain embodiments, the LF/(HF+LF) power ratio is below about 0.8. In certain embodiments, the resulting film has a tensile stress ranging from 0 to 100 Mpa. In certain embodiments, the film has a tensile stress of at least about 50 Mpa.

Another aspect of the invention relates to a high deposition rate method of forming a compressive TEOS oxide film on a substrate involving providing a semiconductor device substrate in a deposition chamber; exposing the substrate to a process gas comprising to a process gas comprising TEOS, oxygen and helium; wherein the TEOS flow rate is between about 10-15 ml/min prior to vaporization and the oxygen flow rate is between about 10000-16000 sccm; and depositing on the substrate a dielectric film by a plasma enhanced chemical vapor deposition (PECVD) process. According to various embodiments, the helium flow rate is between about 1000-4000 sccm, for example about 2000 sccm. In certain embodiments, the total RF power is between about 2000-2800 W. The LF/(LF+HF) power ratio is above about 0.8. According to various embodiments, the resulting film has a compressive stress 150-400 Mpa.

DETAILED DESCRIPTION OF THE PREFERRED EMBODIMENTS

Introduction

Figure 1:
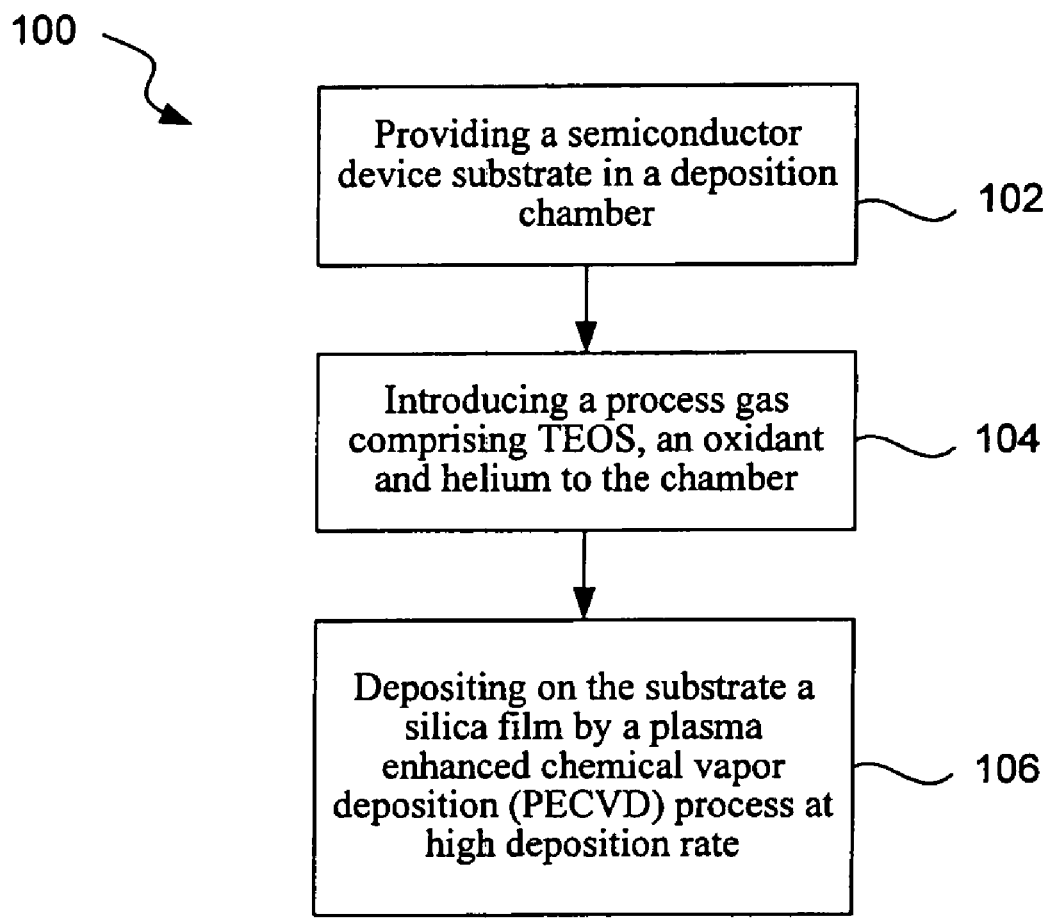
FIG. 1 is a process flow diagram illustrating aspects of some embodiments of the invention employed for depositing a TEOS oxide film on a substrate.

In the following detailed description of the present invention, numerous specific embodiments are set forth in order to provide a thorough understanding of the invention. However, as will be apparent to those skilled in the art, the present invention may be practiced without these specific details or by using alternate elements or processes. In other instances well-known processes, procedures and components have not been described in detail so as not to unnecessarily obscure aspects of the present invention.

In this application, the terms "semiconductor wafer", "wafer" and "partially fabricated integrated circuit" will be used interchangeably. One skilled in the art would understand that the term "partially fabricated integrated circuit" can refer to a silicon wafer during any of many stages of integrated circuit fabrication thereon. The following detailed description assumes the invention is implemented on a wafer. However, the invention is not so limited. The work piece may be of various shapes, sizes, and materials. In addition to semiconductor wafers, other work pieces that may take advantage of this invention include various articles such as printed circuit boards and the like.

Tri-ethoxy-organo-silicate ("TEOS") is a silicon-containing compound that is a liquid at room temperature and that is used in many applications to deposit silicate films on semiconductor wafers. TEOS is often used in place of silane for applications that require good conformality, for example, when the wafer surface contains recessed features or other irregularities.

Silicon dioxide films deposited using TEOS (also called TEOS oxide films or TEOS films) may be deposited by thermal or plasma-enhanced chemical vapor deposition processes using a process gas containing TEOS and an oxidant, typically oxygen or ozone. The methods of the present invention involve plasma enhanced deposition chemical vapor (PECVD) processes.

Known processes for depositing TEOS are low deposition rate processes, resulting in about 3000-4000 angstroms of film/min (on a bare substrate). It would be desirable to have high deposition rate processes for depositing TEOS films. However, to date, high deposition rate methods of depositing a silicon oxide films result in films with a high number of defects. For example, high rate deposition process (~8800 angstroms/min) using a TEOS/$O_2$ process gas at 400° C. show over 300 defects with a bin size of greater than 0.1 micrometers in a given processed wafer. Current defect requirements for TEOS films are much smaller due to shrinking device size.

The methods of the present invention provide high-deposition rate processes for depositing low defect TEOS film by PECVD. The methods involve incorporating a small amount of helium in the TEOS/$O_2$ process gas. It has been found that the addition of helium significantly reduces the number of defects in the dielectric film.

Methods of the invention use plasmas that are produced from gases that contain TEOS, an oxidant and helium. One skilled in the art will recognize that the actual species present in the plasma may be a mixture of different ions and molecules derived from these gases. It is noted that other species may be present in the reaction chamber, such as small hydrocarbons, carbon dioxide, water vapor and other volatile components. One of skill in the art will also recognize that reference to the initial gas/gases introduced into the plasma is/are different from other gas/gases that may exist after the plasma is formed.

As indicated above, previous known methods for depositing TEOS films at high deposition rates result in a large number of defects. PECVD reactions involve exciting the process gas so that activated species such as ions and radicals are formed. Free electrons excited by the plasma source reactant with reactant gases to form ions and radicals. Deposition occurs by the absorption or reaction of activated species onto the substrate surface. The activated species or reaction products may be incorporated into the deposited films or return to the gas phase from the surface.

Defects in the deposited film are typically the results of particles being incorporated into the film during deposition. For example, particles may be formed by gas phase agglomeration of reactant molecules, by interactions in the plasma between activated species, and by unreacted reactant gases. This process is generally called as gas phase nucleation Without being bound by a particular theory, it is believed that the addition of helium significantly reduces the number of defects in the deposited TEOS film by one or more of the following mechanisms:

Helium dilutes the process gas, preventing or reducing gas phase agglomeration. In PECVD processes, the reaction energy is supplied in part by the plasma. Atoms and compounds are ionized; the resulting ions and free electrons are accelerated by the electric field and under go collisions. Heavy particles, however, are unaffected by the electric field. Instead of reacting to form silicate glass, the particles are incorporated as such into the deposited film. These particles may be generated by agglomeration of compounds in the process gas. As gas phase agglomeration is typically a heavy body phenomenon, diluting the oxygen-rich process gas with lighter helium reduces the number of heavy bodies that produce the agglomerations. As indicated, a possible mechanism for reducing the number of particles in the film is the reduction of gas phase agglomeration by introducing helium gas.

Particles may also be generated through plasma interactions (e.g., attraction between charged reactive species in the plasma) and become trapped in regions in the plasma (referred to as "plasma trapping regions") distributed throughout the chamber. Plasma trapping regions are regions where gas phase plasma species attractions are favored. The particles may grow in the plasma trapping regions and eventually be deposited on the substrate surface and become incorporated into the TEOS oxide. Generally the TEOS-O2 plasma contains ions, electrons and neutral species. The mutual attraction between the charged species and neutrals leads to particle nucleation and growth. Location of the plasma trapping regions and the ability to grow particles is affected by properties of the plasma including the plasma density, plasma potential, temperature distribution and other factors. Adding helium to the process gas alters all of these properties, thereby altering the chemistry of the plasma and ability to grow particles in the plasma trapping regions. It is believed that the helium component of the plasma reduces growth and deposition of particles. For example, plasma density, a measure of the number of electrons and ions in the plasma, increases by the addition of helium. The addition of helium makes the plasma more electropositive in nature, which helps stabilize the electronegative plasma (TEOS-O2), reducing the number of plasma trapping regions and particles formed. For example, the additional electrons supplied by helium ionize the oxygen radicals that may have formed. Helium is a good thermal conductive gas which could lead to a uniform temperature distribution in the plasma by the addition of helium. Helium takes less energy from the plasma than the other reactants due to its low ionization energy. This provides more energy to decompose oxygen and TEOS, and reducing the number of particles formed.

Particles may also be formed and incorporated into the film by the incomplete reaction of TEOS and oxygen. The presence of the lightweight helium may help carry the TEOS throughout the chamber, resulting in a more uniform distribution of reactive species and higher conversion of the TEOS gas. Fewer particles are thus formed and defects are reduced.

Although these are mechanisms by which it is believed the addition of helium reduces particles and defects in deposited films, the invention is not limited to any particular mechanism.

Process

FIG. 1 is a flow chart depicting one general high-level process flow in accordance with some embodiments of the present invention. The process (100) begins when a substrate is provided to a deposition chamber (102). The substrate is typically a semiconductor wafer that may be bare or may have other layers, e.g. dielectric or conductive layers, deposited on it depending on the application. Examples of applications of TEOS oxide films are described below. A process gas including TEOS, an oxidant and helium is then introduced to the chamber (104). Examples of oxidants include oxygen and ozone, with oxygen used in a particular embodiment. The process gas may also include one or more dopant gases, including carbon dioxide. Silica film is then deposited on the substrate surface by a high deposition rate PECVD reaction (106).

As indicated above, deposition rates are high, for example at least about 7000 angstroms/minute initially. In particular embodiments, initial deposition rates are at least at least about 8000 angstroms/minute, about 9000 angstroms/min, about 9500 angstroms/min, 9700 angstroms/min, and 10000 angstroms/min. Deposition rates as increase as film accumulates on the substrate; for a substrate on which a thick layer of film has already accumulated, the deposition rate may be around 20,000-30,000 angstroms/min. TEOS and oxidant flow rates are high in order to deposit the film at a high deposition rate. For example, TEOS flow rate may range from about 12-20 ml/min. In particular embodiments, the TEOS flow rate may be at least about 13 ml/min, 14 ml/min, 15 ml/min or 19 ml/min. The oxidant is typically oxygen. Oxygen flow rates may range from about 6000 sccm-12000 sccm, or in particular embodiments from about 8000-12000 sccm. (Low deposition TEOS processes may have, for example, TEOS flow rates from 5-6 ml/min and oxygen flow rates ranging from 5000-8000 sccm.)

According to various flow rates, helium flow rates range from about 1000-4000 sccm, and from about 2000-4000 sccm, or about 2000-3000 in certain embodiments. If the helium flow rate is too low, the beneficial effects discussed above from the addition of helium are not observed. Likewise if the helium flow rate is too high, the beneficial effects may be minimized. This may be because the addition of large amount of helium makes the plasma more parasitic (unstable and unconfined plasma) with the given process conditions and also decreases the deposition rate.

Of course, the total flow rate of gas and other conditions in the deposition chamber can vary depending upon, among other factors, RF power, chamber pressure and substrate (wafer) size. The above flow rates are for 300 mm wafers; one of skill in the understand that the flow rates may be adjusted for high deposition rate PECVD of TEOS on 200 mm or other sized substrates. Chamber pressures will typically range between about 2.0 to 4.0 Torr and wafer temperature from 350 C-400 C. RF power typically ranges from 2000 W to 3000 W.

Applications of PECVD TEOS oxide film include interlayer dielectrics, dielectric gap fill, gate dielectrics, barrier and cap layers. As indicated above, silicon oxide films deposited with TEOS have improved conformality and step coverage over PECVD processes that use silane. Of course the methods of the invention incorporate other processes; for example, PECVD TEOS gap fill processes may alternate sputter etch steps with TEOS oxide deposition.

Relative flow rates of the reactant gases as well as RF power may depend on the desired characteristics of the film. For example, in certain applications, a tensile film is required. The etch selectivity is controlled by the film stress. Therefore, in order to tailor the etch selectivity for a given application; controlling film stress is key. For depositing a tensile film, TEOS flow rates of between 15-20 ml/min, oxygen flow rates of between 8000-12000 sccm and helium flow rates of between 1000 sccm and 4000 sccm may be used. In a specific example, a TEOS flow rate of about 14 ml/min, and oxygen flow rate of about 10000 sccm and a helium flow rate of 2000 sccm is used. The RF power used may be relatively low, for example, between 1500 W-2000 W. In certain embodiments, the LF/(LF+HF) power ratio may also be relatively low, for example, below about 0.8. The resulting film may have a tensile film of between about 0 to 100 Mpa; and in certain embodiments, of at least 50 Mpa.

In other applications, the desired film has high compressive stress, for example diffusion barriers and cap layers. For depositing a compressive film, TEOS flow rates of between 10-15 ml/min, oxygen flow rates of between 8000-16000 and a helium flow rate of between 1000 sccm and 4000 sccm may be used. In a specific example, a TEOS flow rate of about 19 ml/mg, and oxygen flow rate of about 8000 sccm and a helium flow rate of 2000 sccm is used. The RF power used may be relatively high, for example, between 2000 W-2800 W. In certain embodiments, the LF/(LF+HF) power ratio may also be relatively high, for example, above about 0.8. The resulting film may have a compressive stress between about 150-400 Mpa.

Apparatus

The present invention is preferably implemented in a plasma enhanced chemical vapor deposition (PECVD) reactor. Such a reactor may take many different forms. Generally, the apparatus will include one or more chambers or "reactors" (sometimes including multiple stations) that house one or more wafers and are suitable for wafer processing. Each chamber may house one or more wafers for processing. The one or more chambers maintain the wafer in a defined position or positions (with or without motion within that position, e.g. rotation, vibration, or other agitation). In one embodiment, a wafer undergoing deposition is transferred from one station to another within a reactor chamber during the process. For example, for a 2000 Å film deposition, 500 Å of film may be deposited at each of four stations in accordance with the present invention. Of course, the full film deposition may occur entirely at a single station or any fraction of the total film thickness may be deposited at any number of stations.

While in process, each wafer is held in place by a pedestal, wafer chuck and/or other wafer holding apparatus. For certain operations in which the wafer is to be heated, the apparatus may include a heater such as a heating plate. In a preferred embodiment of the invention, a Vector™ (e.g., C23 Vector) or Sequel™ (e.g., C2 Sequel) reactor, produced by Novellus Systems of San Jose, Calif., may be used to implement the invention.

Figure 3:
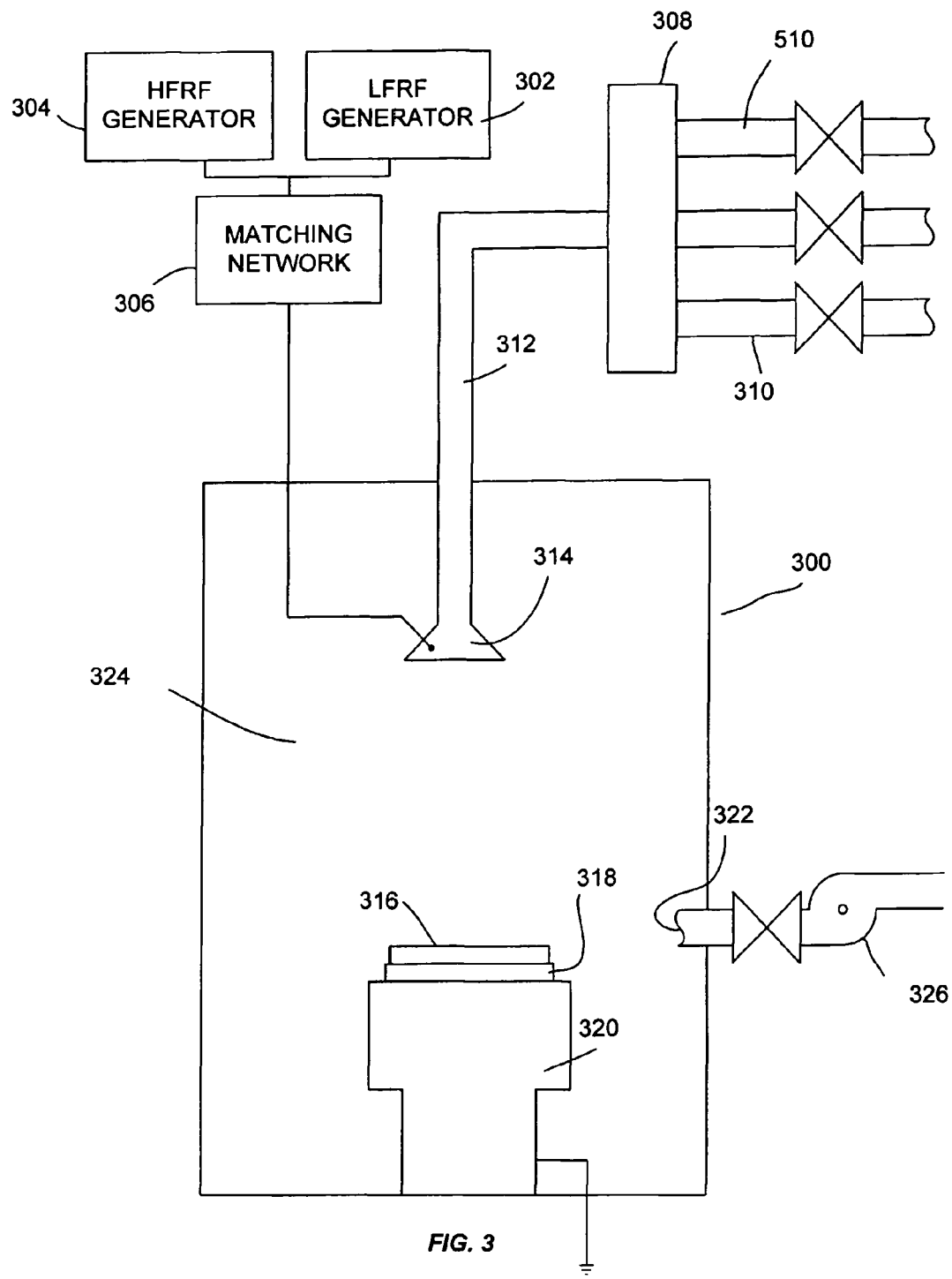
FIG. 3 is a schematic illustration showing an apparatus suitable for practicing the present invention.

FIG. 3 provides a simple block diagram depicting various reactor components arranged for implementing the present invention. As shown, a reactor 300 includes a process chamber 324, which encloses other components of the reactor and serves to contain the plasma generated by a capacitor type system including a showerhead 314 working in conjunction with a grounded heater block 320. A high-frequency RF generator 302, connected to a matching network 306, and a low-frequency RF generator 304 are connected to showerhead 314. The power and frequency supplied by matching network 306 is sufficient to generate a plasma from the process gas, for example 400-700 W total energy. In a typical process, the high frequency RF component is generally between 2-60 MHz; in a preferred embodiment, the HF component is 13.56 MHz. In a typical process, the power of the lower frequency component is generally between 1800 to 2400 W.

Within the reactor, a wafer pedestal 318 supports a substrate 316. The pedestal typically includes a chuck, a fork, or lift pins to hold and transfer the substrate during and between the deposition and/or plasma treatment reactions. The chuck may be an electrostatic chuck, a mechanical chuck or various other types of chuck as are available for use in the industry and/or research.

The process gases are introduced via inlet 312. Multiple source gas lines 310 are connected to manifold 308. The gases may be premixed or not. Appropriate valving and mass flow control mechanisms are employed to ensure that the correct gases are delivered during the deposition and plasma treatment phases of the process. In case the chemical precursor(s) is delivered in the liquid form (such as TEOS), liquid flow control mechanisms are employed. The liquid is then vaporized and mixed with other process gases during its transportation in a manifold heated above its vaporization point before reaching the deposition chamber.

Process gases exit chamber 300 via an outlet 322. A vacuum pump 326 (e.g., a one or two stage mechanical dry pump and/or a turbomolecular pump) typically draws process gases out and maintains a suitably low pressure within the reactor by a close loop controlled flow restriction device, such as a throttle valve or a pendulum valve.

The invention may be implemented on a multi-station or single station tool. In specific embodiments, the 300 mm Novellus Vector™ tool having a 4-station deposition scheme or the 200 mm Sequel tool having a 6-station deposition scheme are used. It is possible to index the wafers after every deposition and/or post-deposition plasma anneal treatment until all the required depositions and treatments are completed, or multiple depositions and treatments can be conducted at a single station before indexing the wafer.

It has been shown that film stress is the same in either case. However, conducting multiple depositions/treatments on one station is substantially faster than indexing following each deposition and/or treatment.

EXPERIMENTAL

As mentioned previously, the present invention is effective at producing low-defect TEOS oxide films at high deposition rates.

Example 1

A tensile TEOS film was deposited on a 300 mm wafer using the following process conditions.

TABLE 1

Process Conditions for 8800 angstrom/min process

| Process Condition | Without Helium | With Helium |
|---|---|---|
| TEOS flow rate (ml/min): | 19 | 19 |
| O$_2$ flow rate (sccm) | 10000 | 8000 |
| He flow rate (sccm) | 00 | 2000 |
| Pressure (Torr) | 3.2 | 3.2 |
| Temperature: | 400 C. | 400 C. |
| HF Power/LF Power (W) | 600/2000 | 600/2000 |
| Deposition rate (angstroms/min) | 8800 | 8800 angstroms/min |

16000 Angstroms of film was deposited on the wafer using a Vector tool. Defects were measured by dark field light scattering using a SP1 system available from KLA-Tencor. The helium process resulted in fewer than 30 defects of greater than 0.1 μm. This is compared to over 300 defects of greater than 0.1 μm in the baseline (without helium) process.

Example 2

TABLE 2

Process Conditions for 7400 angstrom/min process

| Process Condition | Without Helium | With Helium |
|---|---|---|
| TEOS flow rate: | 14 | 14 |
| O$_2$ flow rate | 14000 | 12000 |
| He flow rate: | 00 | 2000 |
| Pressure: | 2.5 | 2.5 |
| Temperature: | 400 | 400 |
| HF Power/LF Power | 250/2250 | 250/2250 |
| Deposition rate | 7400 | 7400 angstroms/min |

Figure 2:
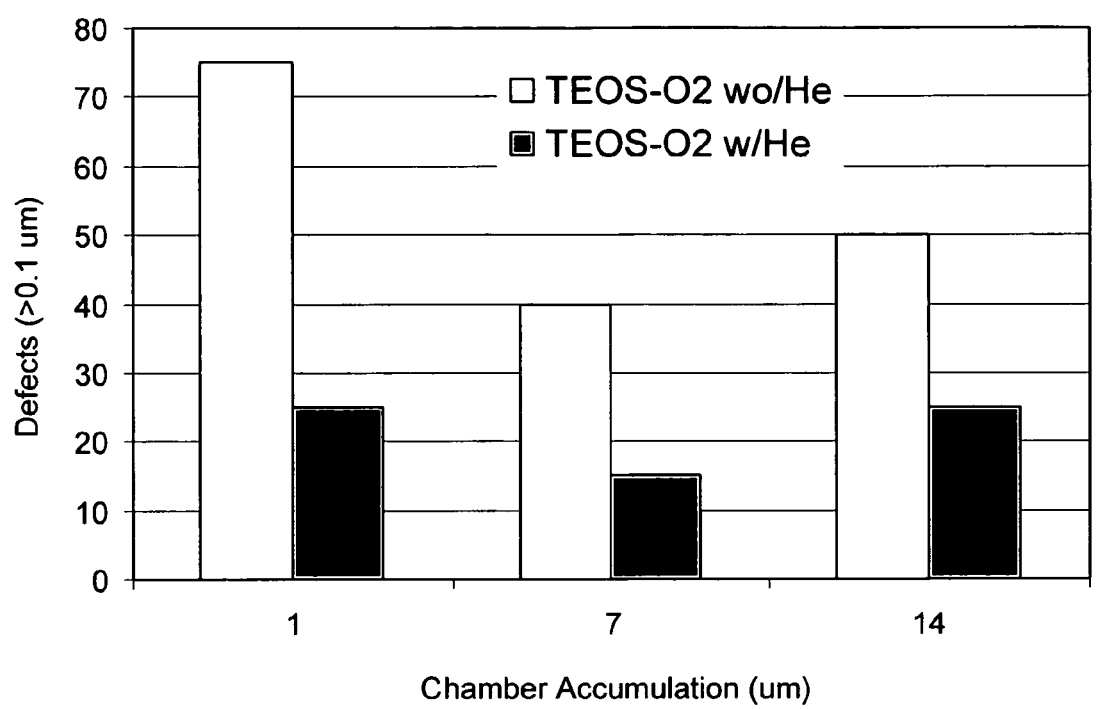
FIG. 2 is a graph comparing the number of defects in TEOS oxide films deposited using helium to the number of defects in films deposited without using helium.

1700 angstroms of film was deposited on wafers in a batch. Defects were measured for wafers at various points in the batch, as indicated by the amount of film accumulated in the chamber (1 μm, 7 μm and 14 μm; 1 μm indicates a wafer processed early in the batch, 7 μm in the middle of the batch and 14 μm late in the batch). Defects were measured as described above in Example 1. FIG. 2 is a chart showing the number of defects for the no helium vs. helium processes for wafers different stages of the batch. As can be seen from the graph, the addition of helium reduces the number of defects greater than 0.1 μm to fewer than 30. The reduction is not as large as for the 8800 angstrom/min process described in Example 1, as the non-helium process has fewer defects than that in Example 1. However, the reduction in defects is still significant. In addition, the fact that the number of defects are about the same regardless of the amount of accumulation shows that the deposition process is stable throughout the batch.

Although various details have been omitted for clarity's sake, various design alternatives may be implemented. Therefore, the present examples are to be considered as illustrative and not restrictive, and the invention is not to be limited to the details given herein, but may be modified within the scope of the appended claims.

What is claimed is:

1. A high deposition rate method of forming a low-defect dielectric material on a substrate comprising:
   providing a semiconductor device substrate in a deposition chamber;
   exposing the substrate to a process gas comprising TEOS, an oxidant and helium, wherein the helium flow rate is between about 2000 sccm and 4000 sccm;
   depositing on the substrate a dielectric film by a plasma enhanced chemical vapor deposition (PECVD) process, wherein the deposition rate is at least about 7000 angstroms/min.

2. The method of claim 1 wherein the deposition rate is at least about 9000 angstroms/min.

3. The method of claim 1 wherein the flow rate of the TEOS prior to vaporization is at least about 13 ml/min.

4. The method of claim 1 wherein the flow rate of the TEOS prior to vaporization is at least about 14 ml/min.

5. The method of claim 1 wherein the helium flow rate is about 2000 sccm.

6. The method of claim 1 wherein the oxidant is oxygen.

7. The method of claim 6 wherein the oxygen flow rate is between about 8000 and 12000 sccm.

8. The method of claim 1 wherein the resulting film has a thickness between about 1000 Angstroms to 30000 Angstroms.

9. The method of claim 1 wherein the resulting film has fewer than about 25 defects larger than 0.1 μm per 1000 Angstroms.

10. A high deposition rate method of forming a low-defect tensile TEOS oxide film on a substrate comprising:
    providing a semiconductor device substrate in a deposition chamber;
    exposing the substrate to a process gas comprising to a process gas comprising TEOS, oxygen and helium; wherein the TEOS flow rate is between about 15 to 20 ml/min prior to vaporization, the helium flow rate is between about 2000-4000 sccm, and the oxygen flow rate is between about 8000-12000 sccm; and
    depositing on the substrate a dielectric film by a plasma enhanced chemical vapor deposition (PECVD) process.

11. The method of claim 10 wherein the helium flow rate is about 2000 sccm.

12. The method of claim 10 wherein the TEOS flow rate is about 14 ml/min and the oxygen flow rate is about 10000 sccm.

13. The method of claim 10 wherein the resulting film has a tensile stress of about 0 to 100 Mpa.

14. A high deposition rate method of forming a low-defect compressive TEOS oxide film on a substrate comprising:
   providing a semiconductor device substrate in a deposition chamber;
   exposing the substrate to a process gas comprising to a process gas comprising TEOS, oxygen and helium; wherein the TEOS flow rate is between about 10-15 ml/min prior to vaporization, the helium flow rate is between about 2000-4000 sccm and the oxygen flow rate is between about 8000-12000 sccm and depositing on the substrate a dielectric film by a plasma enhanced chemical vapor deposition (PECVD) process.

15. The method of claim 14 wherein the helium flow rate is about 2000 sccm.

16. The method of claim 14 wherein the TEOS flow rate is about 19 ml/min and the oxygen flow rate is about 8000 sccm.

17. The method of claim 14 wherein the resulting film has a compressive stress of between 150-400 Mpa.

18. A high deposition rate method of forming a low-defect compressive TEOS oxide film on a substrate comprising:
   providing a semiconductor device substrate in a deposition chamber;
   exposing the substrate to a process gas comprising to a process gas comprising TEOS, oxygen and helium; wherein the TEOS flow rate is between about 10-20 ml/min prior to vaporization, the helium flow rate is between about 1000-4000 sccm and the oxygen flow rate is between about 8000-12000 sccm and
   depositing on the substrate a dielectric film by a plasma enhanced chemical vapor deposition (PECVD) process.

19. A high deposition rate method of forming a low-defect dielectric material on a substrate comprising:
   providing a semiconductor device substrate in a deposition chamber;
   exposing the substrate to a process gas comprising TEOS, an oxidant and helium; and depositing on the substrate a dielectric film by a plasma enhanced chemical vapor deposition (PECVD) process, wherein the deposition rate is at least about 7000 angstroms/min and wherein the resulting film has fewer than about 100 defects larger than 0.1 µm per 1000 Angstroms.

* * * * *

UNITED STATES PATENT AND TRADEMARK OFFICE
CERTIFICATE OF CORRECTION

| | |
|---|---|
| PATENT NO. | : 7,923,376 B1 |
| APPLICATION NO. | : 11/396303 |
| DATED | : April 12, 2011 |
| INVENTOR(S) | : N. Arul Dhas et al. |

It is certified that error appears in the above-identified patent and that said Letters Patent is hereby corrected as shown below:

In the Claims

In claim 18, column 10, line 7:

change "between about 1000-4000 sccm and the oxygen flow rate" to --between about 2000-4000 sccm and the oxygen flow rate--.

Signed and Sealed this
Eleventh Day of November, 2014

Michelle K. Lee
*Deputy Director of the United States Patent and Trademark Office*